United States Patent
Wu

(10) Patent No.: US 12,265,048 B2
(45) Date of Patent: Apr. 1, 2025

(54) MOISTURE DETECTION ALONG INPUT/OUTPUT OPENING IN IC STRUCTURE

(71) Applicant: GlobalFoundries U.S. Inc., Malta, NY (US)

(72) Inventor: Zhuojie Wu, Port Chester, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 230 days.

(21) Appl. No.: 18/058,349

(22) Filed: Nov. 23, 2022

(65) Prior Publication Data

US 2024/0167974 A1    May 23, 2024

(51) Int. Cl.
*G01N 27/22*    (2006.01)
*G02B 6/12*    (2006.01)

(52) U.S. Cl.
CPC ....... *G01N 27/223* (2013.01); *G02B 6/12004* (2013.01); *G02B 2006/12138* (2013.01)

(58) Field of Classification Search
CPC ............. G01N 27/223; G02B 6/12004; G02B 2006/12138; G02B 6/30; H01L 23/585
USPC .................... 324/686, 658, 649, 600
See application file for complete search history.

(56) References Cited

U.S. PATENT DOCUMENTS

| 7,098,676 | B2 | 8/2006 | Anders et al. | |
|---|---|---|---|---|
| 9,146,206 | B2 * | 9/2015 | Rhodes ............... | G01N 27/223 |
| 9,947,602 | B2 | 4/2018 | Wu et al. | |
| 10,060,974 | B2 * | 8/2018 | Fry ..................... | G01R 31/2896 |
| 10,770,407 | B2 | 9/2020 | Wu et al. | |
| 2012/0000284 | A1 * | 1/2012 | Yokoyama ........... | G01D 11/245 |
| | | | | 29/527.1 |
| 2012/0000285 | A1 * | 1/2012 | Waga ................... | G01N 27/223 |
| | | | | 29/595 |
| 2016/0327502 | A1 | 11/2016 | Chen et al. | |
| 2017/0110416 | A1 * | 4/2017 | Miao ................... | G06V 40/1329 |
| 2019/0129094 | A1 * | 5/2019 | Lin ..................... | G01N 21/7703 |
| 2020/0116631 | A1 * | 4/2020 | Sakamoto ............ | G01N 21/552 |
| 2020/0319675 | A1 | 10/2020 | Beckham et al. | |

(Continued)

OTHER PUBLICATIONS

Notice of Allowance from related U.S. Appl. No. 17/929,404, dated Jun. 26, 2024, 22 pages.

*Primary Examiner* — Giovanni Astacio-Oquendo
(74) *Attorney, Agent, or Firm* — Jessie Cheah; Hoffman Warnick LLC

(57) ABSTRACT

An integrated circuit (IC) structure includes a substrate; and a plurality of moisture sensors along an edge of an optical input/output (I/O) opening in the substrate. The plurality of moisture sensors are positioned between a primary guard ring and a moisture barrier. The moisture sensors may detect moisture in a sequential manner to monitor moisture ingress and predict when remedial action is necessary. The teachings of the disclosure may be applicable to any IC structure including an I/O opening, and in particular, IC structures that have elongated I/O openings such as photonic integrated structures (PICs) with optical I/O openings for photonics components, e.g., an optical fiber or an external laser. The moisture sensors provide an early and definitive alarm for moisture, with no false alarms. The system accurately predicts time to failure and allows adjustment based on real time field data input.

20 Claims, 9 Drawing Sheets

(56) References Cited

U.S. PATENT DOCUMENTS

2021/0183791 A1  6/2021  Sahin et al.
2021/0356514 A1  11/2021  Polomoff et al.

* cited by examiner

MOISTURE DETECTION ALONG INPUT/OUTPUT OPENING IN IC STRUCTURE

BACKGROUND

The present disclosure relates to integrated circuit (IC) structures and, more particularly, to moisture detection along an input/output opening in an IC structure.

Integrated circuit (IC) structures or chips can fail or be damaged when moisture enters the structure, e.g., within a guard ring. Photonics integrated circuit (PIC) structures are especially prone to moisture ingress due to openings in their guard ring, e.g., used to connect to external photonics components. Early and definitive detection of moisture ingress before chip failure is a challenge. Some moisture detection techniques, such as a leakage test, are inaccurate or lack sensitivity. Hence, these techniques oftentimes result in late detection of moisture when remedial action may be impossible. Other moisture detection techniques perform destructive tests, such as a voltage breakdown shift test or a time dependent dielectric breakdown (TDDB) test and cannot be used in a final IC chip product. On-chip moisture monitors that can be used in a final IC chip product often use too much area, and still detect moisture too late to prevent damage or take appropriate remedial action. PIC structures may use single moisture sensors at an outer end of a long optical I/O opening, e.g., 2 millimeters, which can lead to premature indications of moisture ingress into the PIC structure.

SUMMARY

All aspects, examples and features mentioned below can be combined in any technically possible way.

An aspect of the disclosure provides an integrated circuit (IC) structure, comprising: a substrate; and a plurality of moisture sensors along an edge of an input/output (I/O) opening in the substrate, the plurality of moisture sensors positioned between a primary guard ring and a moisture barrier.

An aspect of the disclosure provides a photonics integrated circuit (PIC) structure, comprising: a substrate; a primary guard ring surrounding active circuitry in the substrate; a moisture barrier surrounding the guard ring; an optical input/output (I/O) opening in the substrate; a photonics component positioned in the optical I/O opening; and a plurality of moisture sensors along an edge of the optical I/O opening in the substrate, the plurality of moisture sensors positioned between the primary guard ring and the moisture barrier.

An aspect of the disclosure provides a method of monitoring for moisture ingress in an integrated circuit (IC) structure, comprising: for a plurality of moisture sensors along an edge of an input/output (I/O) opening in a substrate of the IC structure, the plurality of moisture sensors positioned between a primary guard ring and a moisture barrier: detecting moisture in the plurality of moisture sensors from a first moisture sensor closest to an outer end of the I/O opening to a last moisture sensor of the plurality of moisture sensors: for each new moisture detection by a new moisture sensor of the plurality of moisture sensors: calculating a first duration from the new moisture detection to any previous moisture detection by a previous moisture sensor of the plurality of moisture sensors; calculating an expected second duration until moisture ingress through the guard ring to active circuitry of the IC structure based on the first duration; and in response to the expected second duration being shorter than a threshold, transmitting a signal to the active circuitry of the IC structure to cause modification of operation of the active circuitry.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
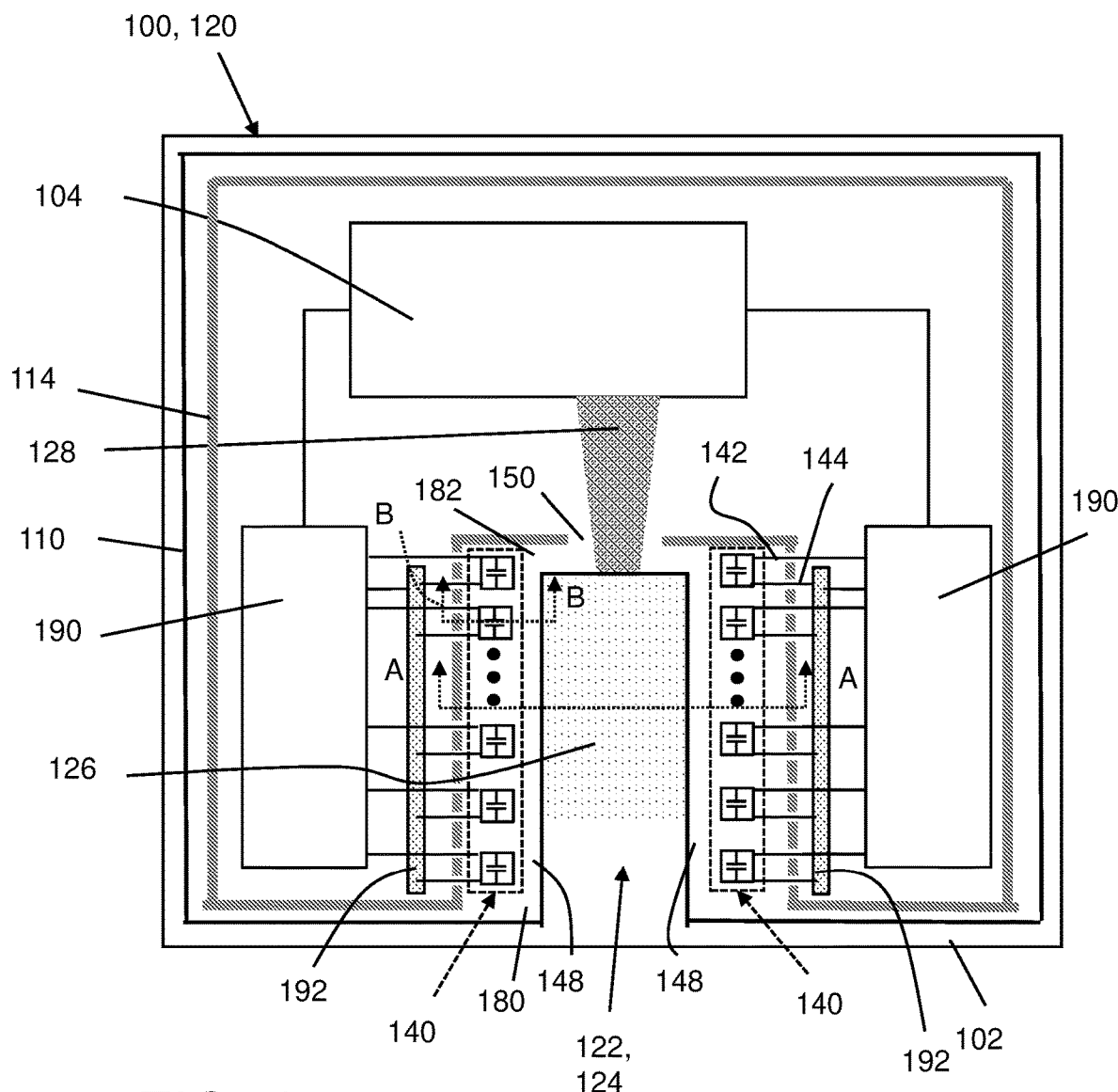
FIG. 1 shows a schematic top-down view of an IC structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (1) only, or the selection of the second listed option (B) only, or the selection of both options (A and B). As a further example, in the cases of "A, B, and/or C" and "at least one of A, B, and C," such phrasing is intended to encompass the first listed option (1) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure. The IC structure includes a substrate, and a plurality of moisture sensors along an edge of an input/output (I/O) opening in the substrate. The plurality of moisture sensors are positioned between a primary guard ring and a moisture barrier. The moisture sensors may detect moisture in a sequential manner to monitor moisture ingress and predict when remedial action is necessary. The teachings of the disclosure may be applicable to any IC structure including an I/O opening, and in particular, IC structures that have elongated I/O openings such as photonic integrated structures (PICs) with optical I/O openings for photonics components, e.g., an external laser. The moisture sensors provide an early and definitive alarm for moisture, with no false alarms. The system accurately predicts time to failure and allows adjustment based on real time field data input but requires no additional area for the moisture sensors.

FIG. 1 shows a schematic top-down view of an integrated circuit (IC) structure 100, according to embodiments of the disclosure. IC structure 100 includes a substrate 102. Substrate 102 can be broadly defined to include a semiconductor substrate upon which active circuitry 104 and other structures are formed; middle-of-line (MOL) and/or back-end-of-line (BEOL) interconnects that electrically interconnect active circuitry 104 and/or photonic components; and/or related packaging layers over BEOL interconnects. IC structure 100 may include any now known or later developed integrated circuit structure or chip including any variety of active circuitry 104 that may experience moisture ingress. Active circuitry 104 can include any form of circuitry including but not limited to: logic, memory, and/or photonics. Moisture ingress into IC structure 100 and active circuitry 104 can damage the physical structure of, for example, active circuitry 104, interconnect layers, photonics, etc.

To prevent moisture ingress, IC structure 100 includes a moisture barrier 110 about active circuitry 104. Moisture barrier 110 may include any now known or later developed barrier configured to resist, and ideally prevent, moisture ingress. Moisture barrier 110 may include but is not limited to an elongated member of silicon nitride or other moisture impervious dielectric material positioned in one or more dielectric interconnect layers. As understood in the field, in some cases, moisture barrier 110 may also provide electric guard ring functionality. However, as illustrated, moisture barrier 110 may be used with a primary guard ring 114 (hereafter "guard ring 114"). Guard ring 114 may include any now known or later developed layered conductive element coupled to ground to electrically isolate active circuitry 104 and other components of IC structure 100 from, among other things, electrical interference. IC structure 100 may also include a crack stop member (not shown for clarity) that surrounds moisture barrier 110 to prevent cracking and/or unwanted stress in the chip.

Figure 2A:
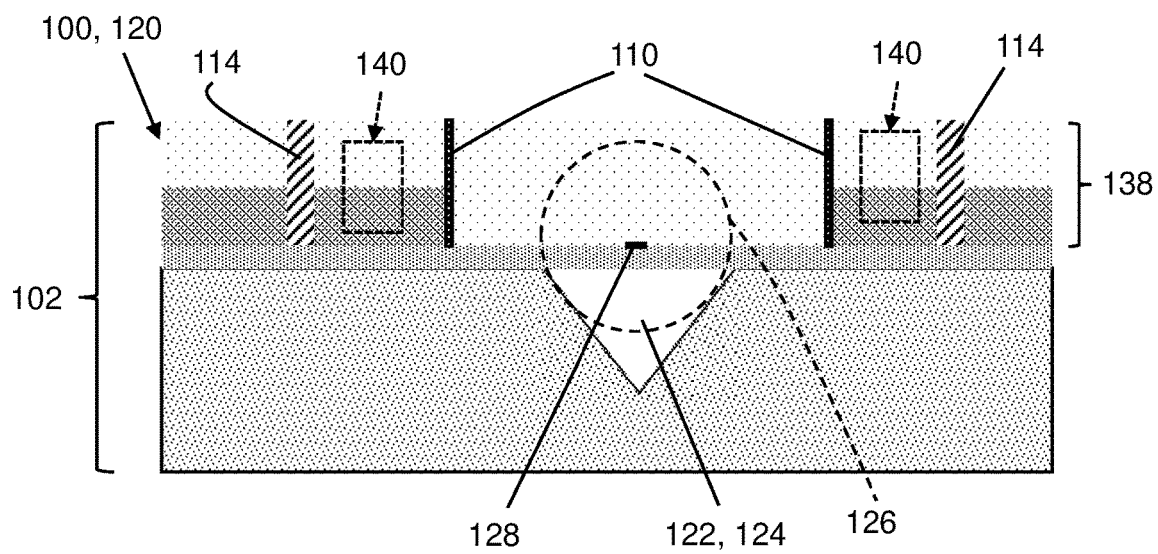
FIG. 2A shows a cross-sectional view of the IC structure of FIG. 1 along view line A-A.
Figure 2B:
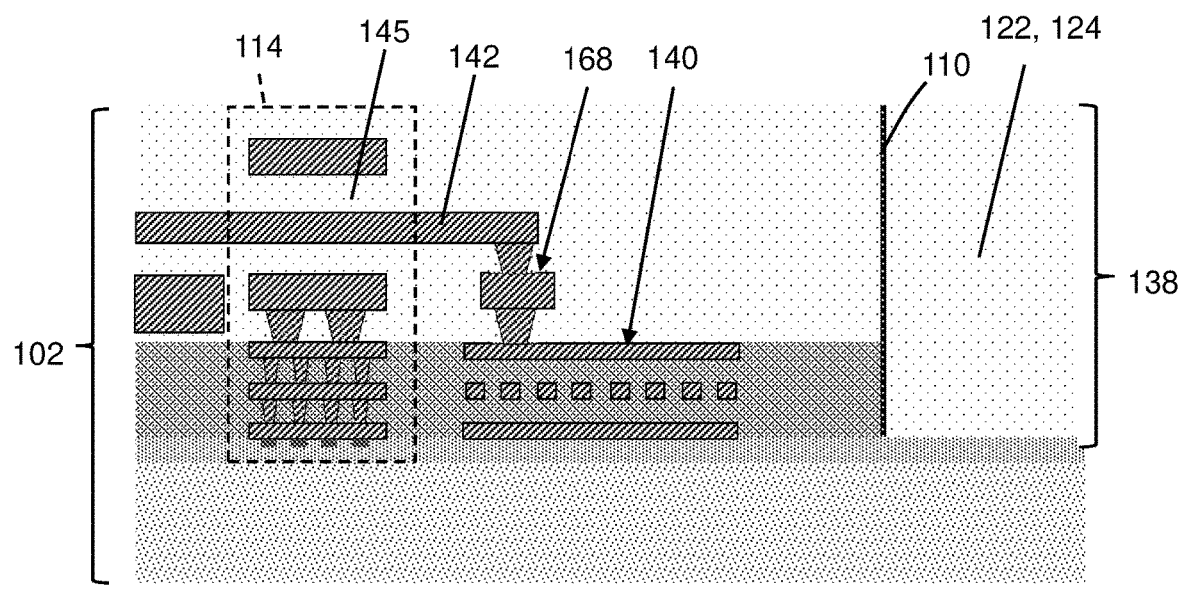
FIG. 2B shows a cross-sectional view of the IC structure of FIG. 1 along view line B-B.

FIG. 2A shows a cross-sectional view of part of IC structure 100 along view line A-A in FIG. 1, and FIG. 2B shows a cross-sectional view of part of IC structure 100 along view line B-B in FIG. 1. As shown in FIGS. 1-2A, IC structure 100 also includes one or more input/output (I/O) opening 124 in at least part of substrate 102. I/O openings 124 can include any opening through which connection to a component external to IC structure is made (e.g., electrical or optical connections to other components) and through which moisture can pass through an opening 150 in guard ring 114.

For purposes of description, IC structure 100 is illustrated as a photonics integrated circuit (PIC) structure 120. PIC structures 120 present a heightened risk of moisture ingress because they include one or more moisture ingress paths 122, e.g., I/O openings 124 or other mechanisms, through which moisture can pass through moisture barrier 110. In this case, I/O openings 124 are 'optical I/O openings' provided for connecting PIC structure 120 to external photonics components 126, such as an optical fiber (perhaps coupled to, e.g., an external laser). (Note, photonics component 126 is shown in a shortened fashion in FIGS. 1 and 4-7 to allow illustration of I/O opening 124.) As shown in FIG. 2A, optical I/O opening(s) 124 may include, for example, a V-groove or alternatively shaped optical I/O opening in substrate 102. In this case, IC structure 100 includes photonics component 126 in optical I/O opening 124—adjacent moisture ingress path 122. In this case, the V-groove (I/O opening 124) positions photonics component 126 and moisture sensors 140 are located along the V-groove. External photonics components(s) 126 may be coupled to, for example, internal optical waveguides 128 that are optically coupled to active circuitry 104 in a known fashion. PIC structure 120, in addition to the structure described herein for IC structure 100, also includes photonics component 126 positioned in optical I/O opening 124, e.g., a V-groove or other shaped seat therefor.

Referring to FIG. 1, in accordance with embodiments of the disclosure, IC structure 100 also includes a plurality of moisture sensors 140 (within dashed box) along an edge 148 of I/O opening 124 in substrate 102. Plurality of moisture sensors 140 (hereinafter "moisture sensors 140") may be on one or both sides (later shown in FIG. 1) of I/O opening 124. The plurality of moisture sensors 140 are positioned between primary guard ring 114 and moisture barrier 110. In this manner, moisture sensors 140 may detect ingress of moisture by moisture barrier 110 as it progresses along I/O opening 124, and toward opening 150 in guard ring 114. As noted, external components, such as external photonic component 126, in I/O opening 124 of IC structure 100 may communicate with internal structure of IC structures, such as an internal optical waveguide 128.

Each moisture sensor 140 may include any now known or later developed structure capable of detecting operational change in the presence of moisture. In one non-limiting example, each moisture sensor 140 may include a capacitor, which can include any now known or later developed capacitor structure. Capacitors may indicate moisture presence, for example, based on current change, current differential, or a hump in a current-voltage response curve. In one embodiment, moisture sensor 140 may include a metal-insulator-metal (MIM) capacitor. MIM capacitors include a first metal electrode separated from a second metal electrode by a dielectric layer. In any event, each capacitor moisture sensor 140 includes a first terminal 142 and a second terminal 144 (shown for just one sensor in FIG. 1).

Figure 3:
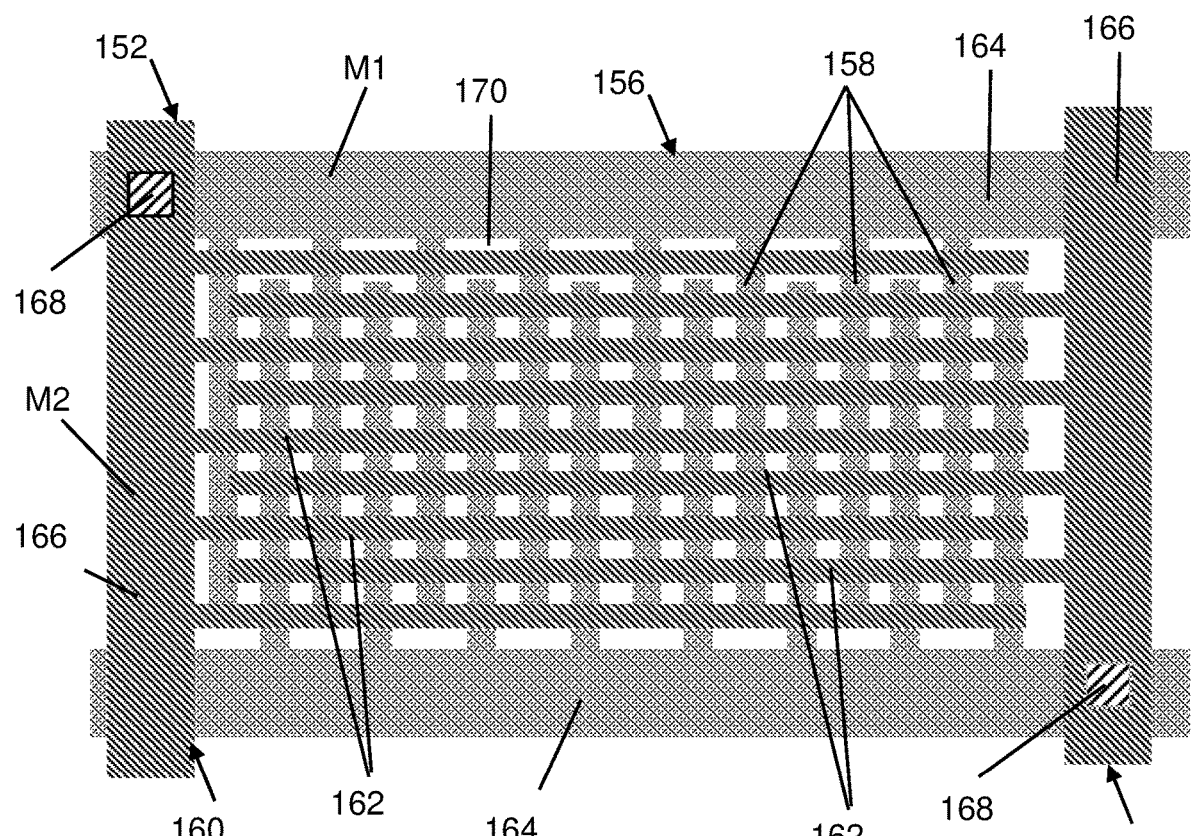
FIG. 3 shows a schematic top-down view of an illustrative moisture sensor in the form of a capacitor for use in an IC structure, according to embodiments of the disclosure.

FIG. 3 shows a schematic top-down view of one example MIM capacitor 152. MIM capacitor 152 includes a first metal electrode 156 that includes a first plurality of digitated elements 158, and a second metal electrode 160 that includes a second plurality of digitated elements 162. Sets of digitated elements 158, 162 are coupled by respective connectors or backbones 164, 166. MIM capacitor 152 can be positioned in any middle-of-line and/or back-end-of-line interconnect layer(s) over substrate 102. For example, first metal electrode 156 may be positioned in a first metal layer, e.g., M1, and second metal electrode 160 may be positioned in a second, different metal layer, e.g., M2. Vias 168 may couple to electrodes 156, 160 in a known fashion, e.g., using a first via layer (V1) between metal layers M1, M2. Further, first metal electrode 156 may connect to first terminal 142 (e.g., using one via 168), and second metal electrode 160 may connect to second terminal 144 (e.g., using another via 168). A dielectric layer 170 is vertically between electrodes 156, 160, and may be part of interconnect (MOL or BEOL) layers 138 (FIGS. 2A-B).

Metal electrodes 156, 160 can include any conductive metal appropriate for complementary metal-oxide semiconductor (CMOS) systems, e.g., copper, tantalum. Dielectric layer 170 may include any capacitor dielectric or interlayer dielectric material, e.g., silicon nitride, silicon oxide, low-k dielectrics. While electrodes 156, 160 are described in adjacent metal layers, e.g., in any back-end-of-line (BEOL) interconnect layers of IC structure 100, they do not need to be in adjacent layers. Moisture sensors 140 (capacitors) can also include MIM capacitors with electrode arrangements other than digitated elements 158, 162, such as but not limited to: parallel metal plate electrodes, metal comb-comb electrode arrangements, vertical native capacitor (VNCAP) arrangements, metal comb and/or serpentine electrode arrangements, and intertwined via-chain arrangements. Moisture sensors 140 can have any cross-sectional shape desired for fitting along edge 148 of I/O opening 124. In some cases, elongated moisture sensors 140 may be advantageous. In some events, moisture sensors 140 do not require any additional space. That is, moisture sensors 140 are positioned in a space between guard ring 114 and moisture barrier 110 that is already present in current IC structures.

As shown by dashed box in FIG. 2A, moisture sensors 140 may be positioned vertically in any number of MOL or BEOL interconnect layers 138. For example, a moisture sensor 140 can be in each interconnect layer 138 or one moisture sensor 140 can extend over many interconnect layers 138.

As shown in FIG. 1, moisture sensors 140 are positioned laterally to extend in a spaced manner from an outer end 180 of I/O opening 124 to an inner end 182 of I/O opening 124. Any number of moisture sensors 140 can be used, e.g., depending on the granularity of detection desired, the space available and/or the size of the sensors. While five moisture sensors 140 are shown on each side of I/O opening 124 in FIG. 1, more or less moisture sensors 140 can be used. The ability to provide additional moisture sensors 140 is indicated by the vertical ellipses in FIG. 1. FIGS. 4-7, for another example, show six moisture sensors 140(1)-140(6).

Figure 9:
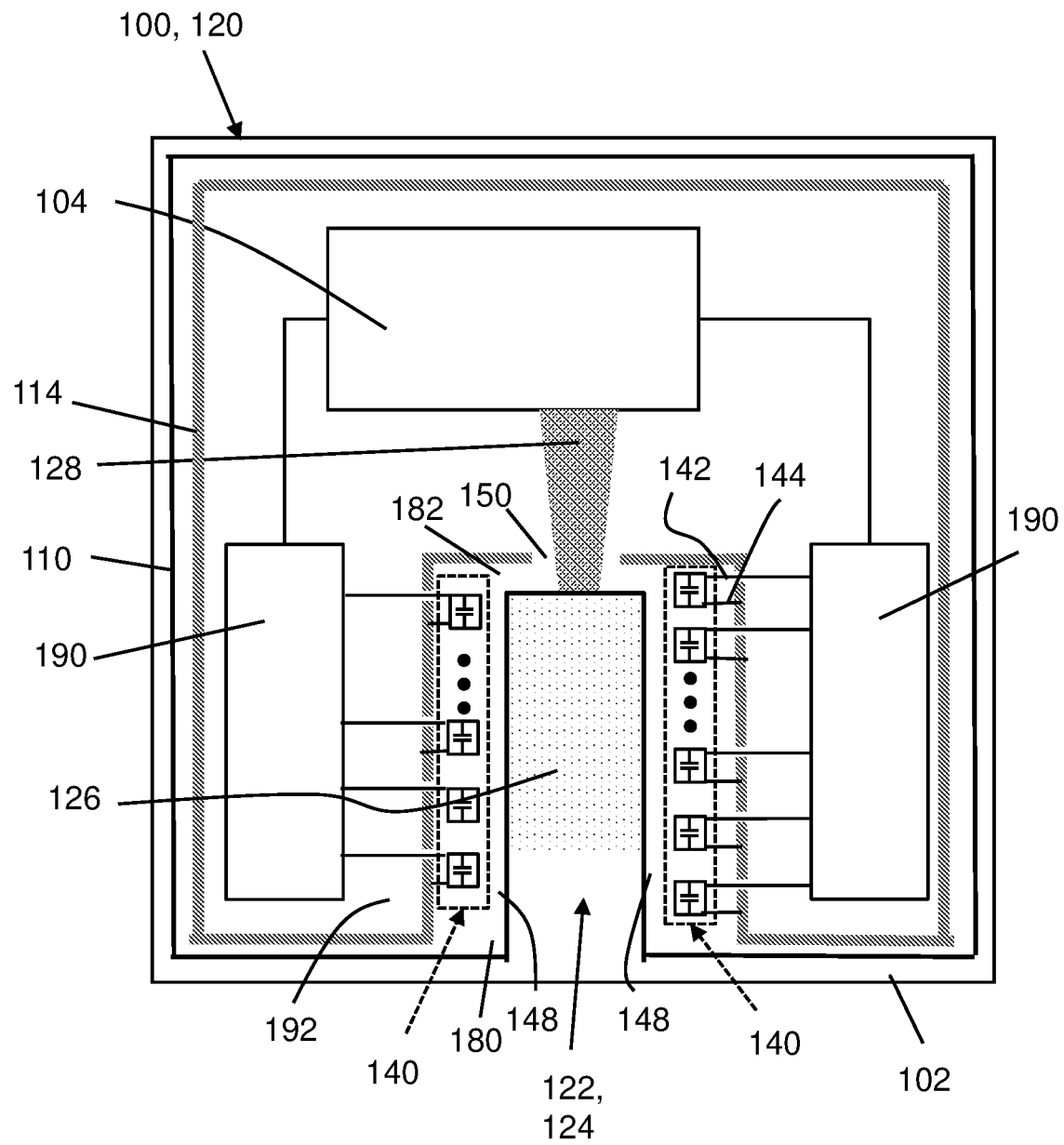
FIG. 9 shows a schematic top-down view of an IC structure, according to other embodiments of the disclosure.

Moisture sensors 140 can be fabricated such that a distance between them is known. The spacing between moisture sensors 140 along with monitoring of the duration between sensing of moisture by each moisture sensor 140 allows calculation of an expected ingress of moisture through opening 150 in guard ring 114, which could lead to failure. In certain embodiments, as noted, the spacing between moisture sensors 140 can be fabricated to be equidistant. That is, the spacing between moisture sensors 140 can be fabricated to be equidistant (within fabrication tolerances) so that the progress of moisture penetration can be more accurately calculated, and an expectation of when moisture ingress into guard ring 114, which likely will cause some sort of failure of IC structure 100, can be calculated.

Where moisture sensors 140 are provided on each edge 148 of I/O opening 124, they can be laterally aligned. In this embodiment, each moisture sensor is directly across I/O opening 124 from a corresponding moisture sensor (vertically on page) and are equidistant on each edge 148 of I/O opening 124. Alternatively, as shown in FIG. 9, moisture sensors 140 on each edge 148 of I/O opening 124 may be offset relative to one another (vertically on page). In this manner, moisture sensors 140 may be collectively spaced closer together than may be possible on a single edge 148, providing more granularity of moisture detection. In either case, a distance between moisture sensors 140 on each edge 148 and relative to moisture sensors 140 on an opposing edge 148 of I/O opening 124 is generally known.

Moisture sensors 140 are operatively coupled to a moisture detection circuit (MDC) 190 that monitors or detects moisture ingress to IC structure 100 according to embodiments of the disclosure. MDC 190 can be internal of guard ring 114 and be a permanent part of a final IC product. While shown as a separate entity, MDC 190 may be part of active circuitry 104. Further, while shown as internal to moisture barrier 110 and guard ring 114, all or part of MDC 190 may be external to IC structure 100, e.g., in the form of an external tester used to test IC structure 100 after manufacture thereof. MDC 190 is shown twice in FIG. 1 (one connected to each plurality of moisture sensors 140 on opposing edges 148 of I/O opening 124) for ease of illustration of the electrical connections to moisture sensors 140. It will be recognized that MDC 190 may include a single circuit and any electrical interconnections thereto can be made through any interconnect layer 138 (FIG. 2A) of IC structure 100 in a known fashion. MDC 190 can include any hardware and/or software capable of performing the functions described herein.

Figure 4:
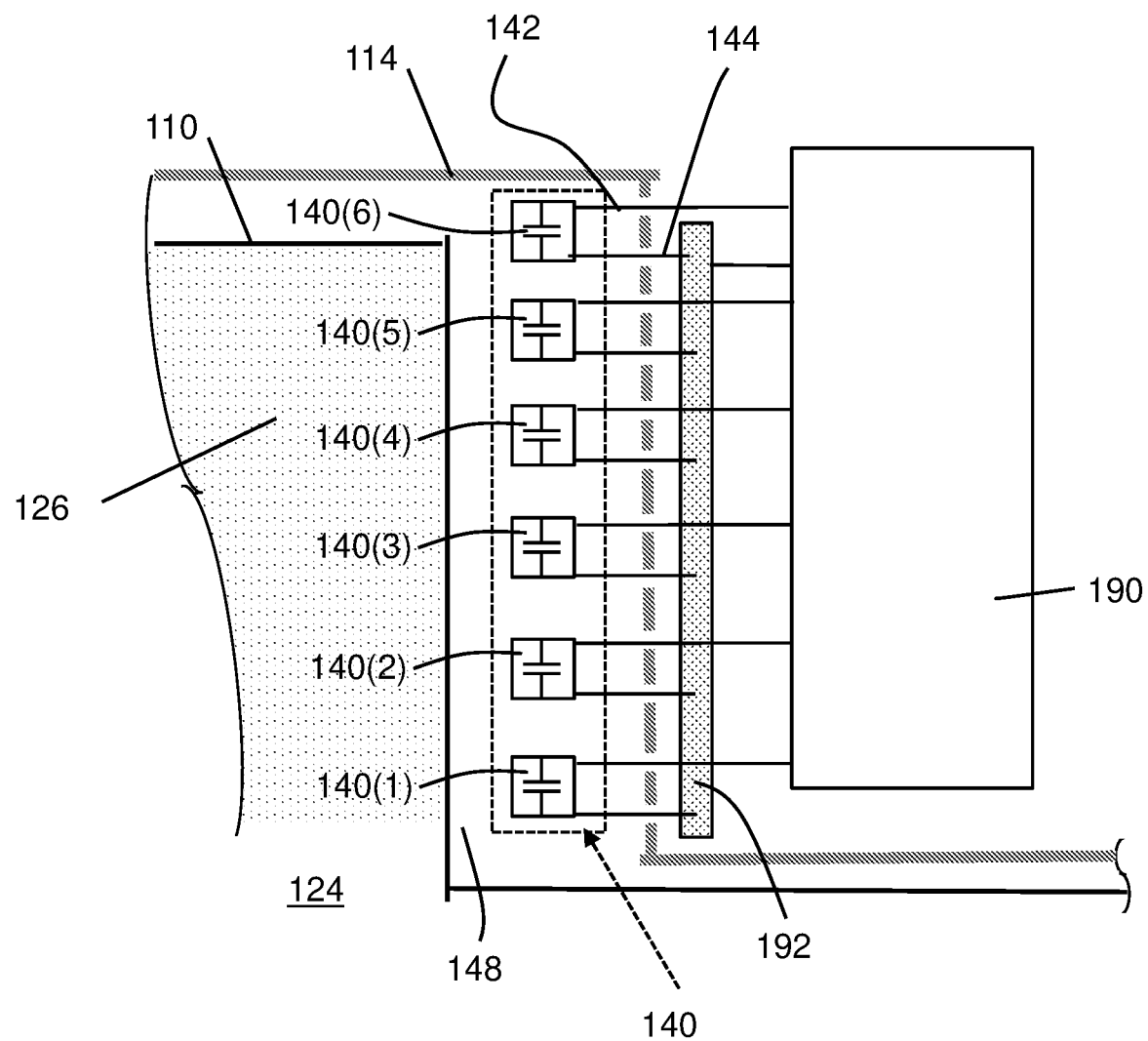
FIG. 4 shows an enlarged schematic top-down view of part of the IC structure of FIG. 1, according to embodiments of the disclosure.
Figure 5:
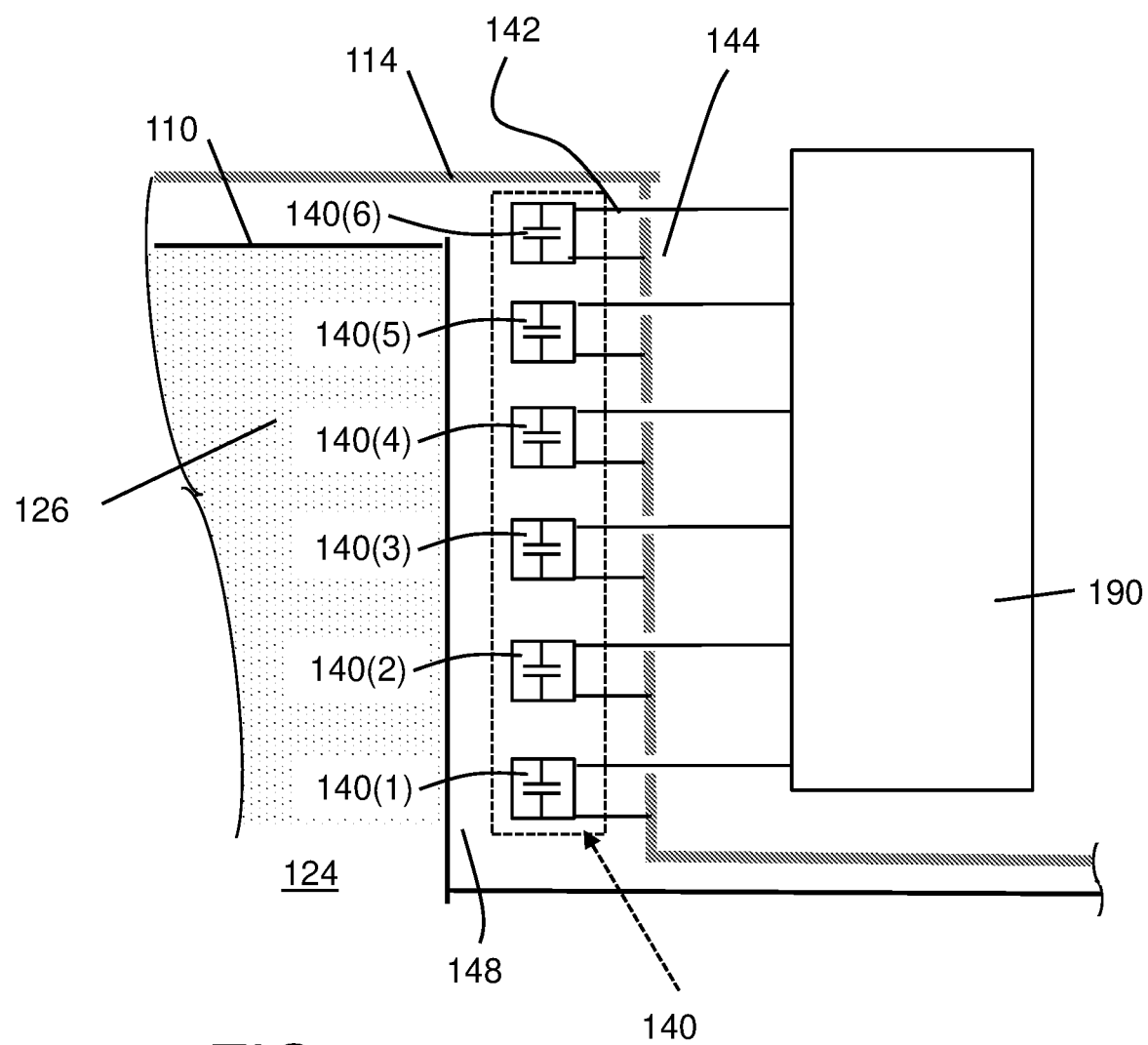
FIG. 5 shows an enlarged schematic top-down view of part of an IC structure, according to other embodiments of the disclosure.
Figure 6:
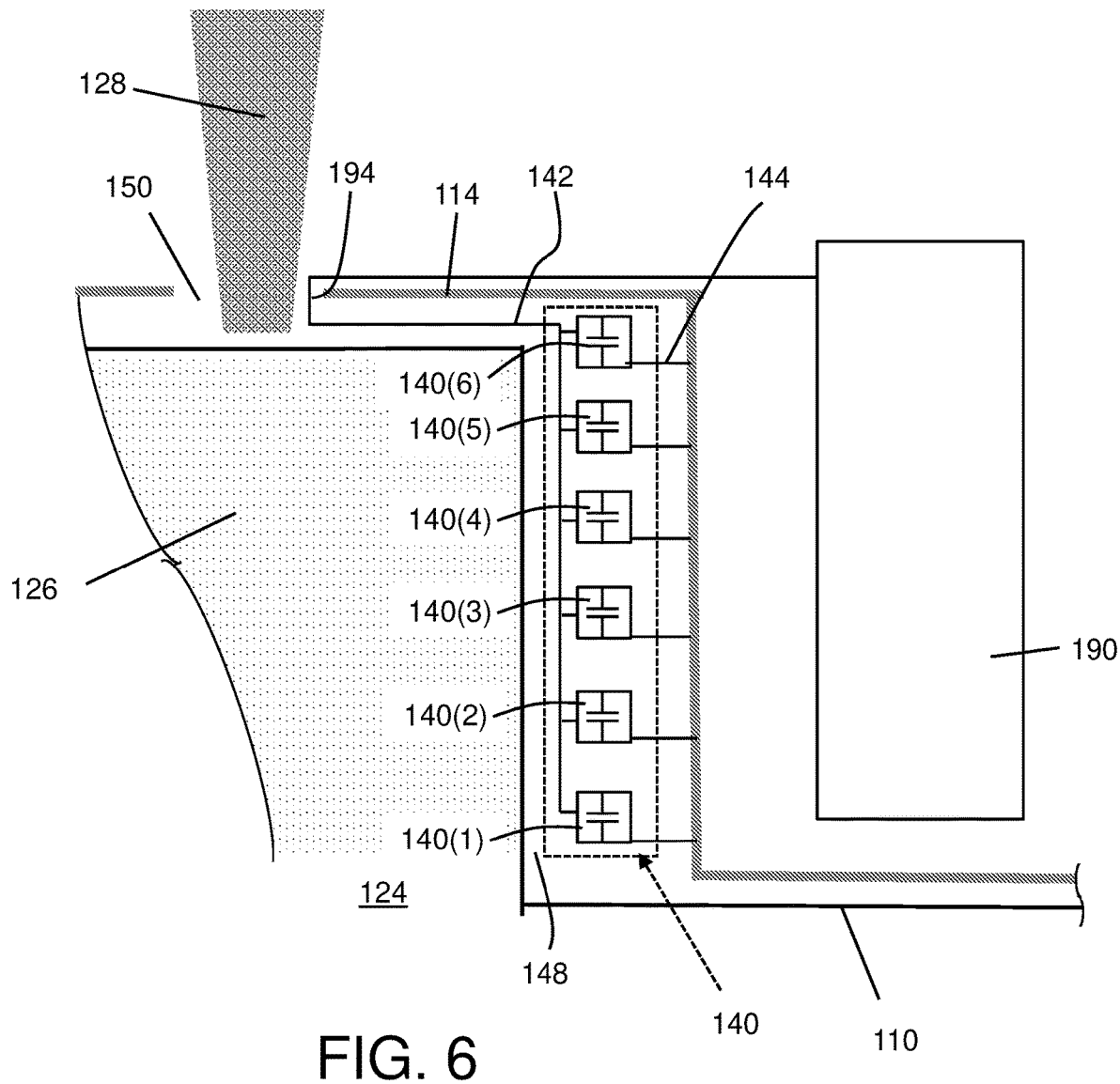
FIG. 6 shows an enlarged schematic top-down view of part of an IC structure, according to other embodiments of the disclosure.

Terminals 142, 144 may electrically connect to MDC 190 through guard ring 114 in a number of ways. As shown in FIG. 1 and the enlarged top-down view in FIG. 4, both the first terminals 142 and the second terminals 144 of moisture sensors 140 may extend through guard ring 114. FIG. 2B shows a simplified illustrative version of one terminal (142) of a moisture sensor 140 extending through an opening 145 in guard ring 114. FIG. 5 shows an enlarged schematic top-down view of part of the IC structure according to other embodiments of the disclosure. In FIG. 5, first terminals 142 extend through guard ring 114, and second terminals 144 are electrically coupled to guard ring 114, e.g., electrical ground. FIG. 6 shows an enlarged schematic top-down view of part of IC structure 100 according to other embodiments of the disclosure. Here, at least one wire 194 extends through opening 150 in guard ring 114 and electrically connects to at least one of first terminals 142 (collectively of moisture sensors 140) (shown), and second terminals 144 of the plurality of moisture sensors 140. While FIGS. 4-6 show terminal 142, 144 connections for moisture sensors 140 on the right side of FIG. 1, it will be recognized that the structure can be repeated for any side of I/O opening 124. Terminals 142, 144 may couple to any structure to allow operation of moisture sensors 140 such as but not limited to: MDC 190, a bus 192 that couples to other structure, or electrical ground.

Figure 7:
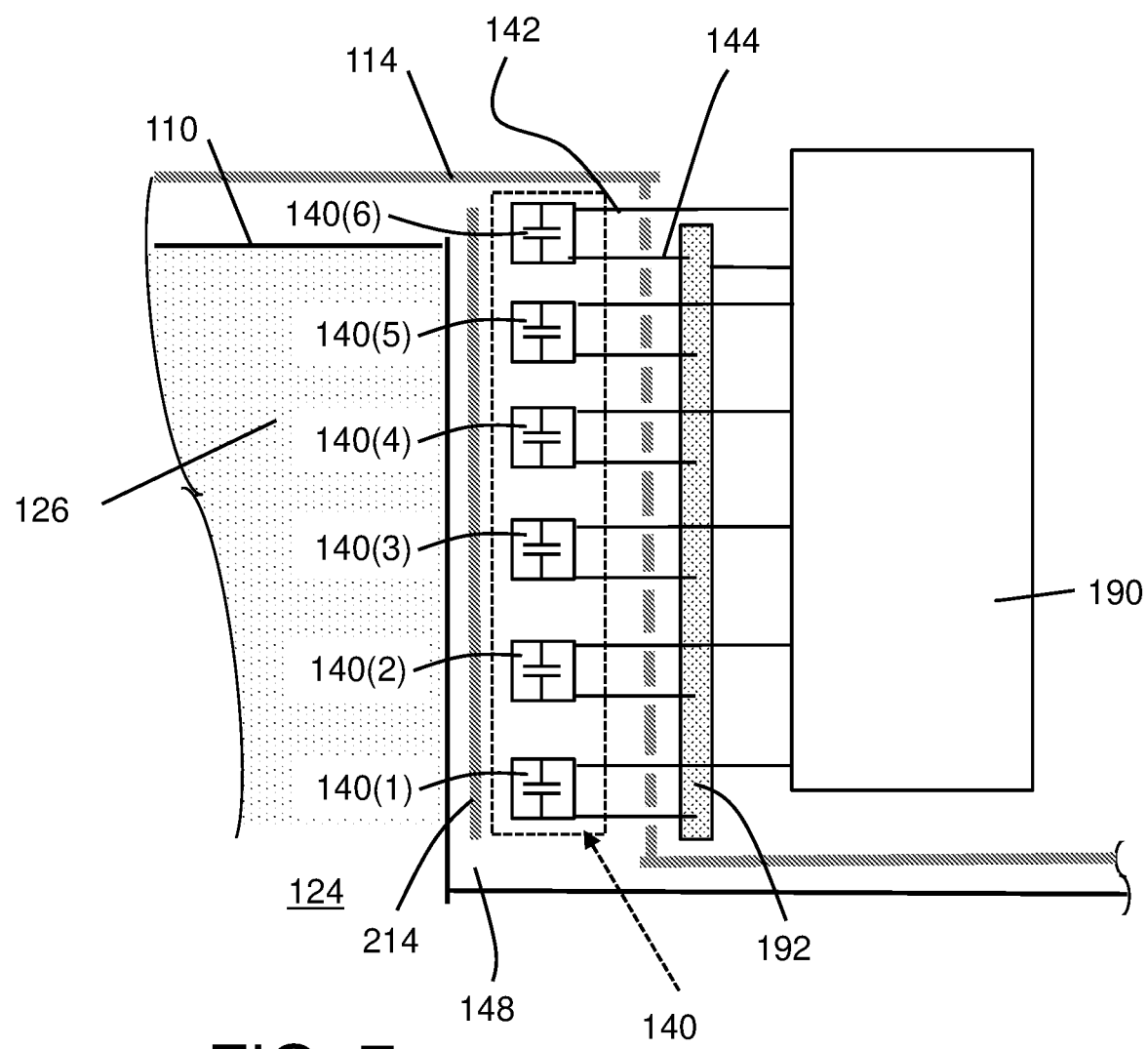
FIG. 7 shows an enlarged schematic top-down view of part of an IC structure, according to other embodiments of the disclosure.

FIG. 7 shows an enlarged schematic top-down view of part of IC structure 100 according to another embodiment of the disclosure. As shown in FIG. 7, IC structure 100 may optionally include a secondary guard segment 214 between plurality of moisture sensors 140 and I/O opening 124. Secondary guard segment 214 is detached from guard ring 114 but may otherwise have the same structure as guard ring 114. Secondary guard segment 214 improves yield of the moisture sensors, e.g., protecting them during formation of I/O opening 124.

Figure 8:
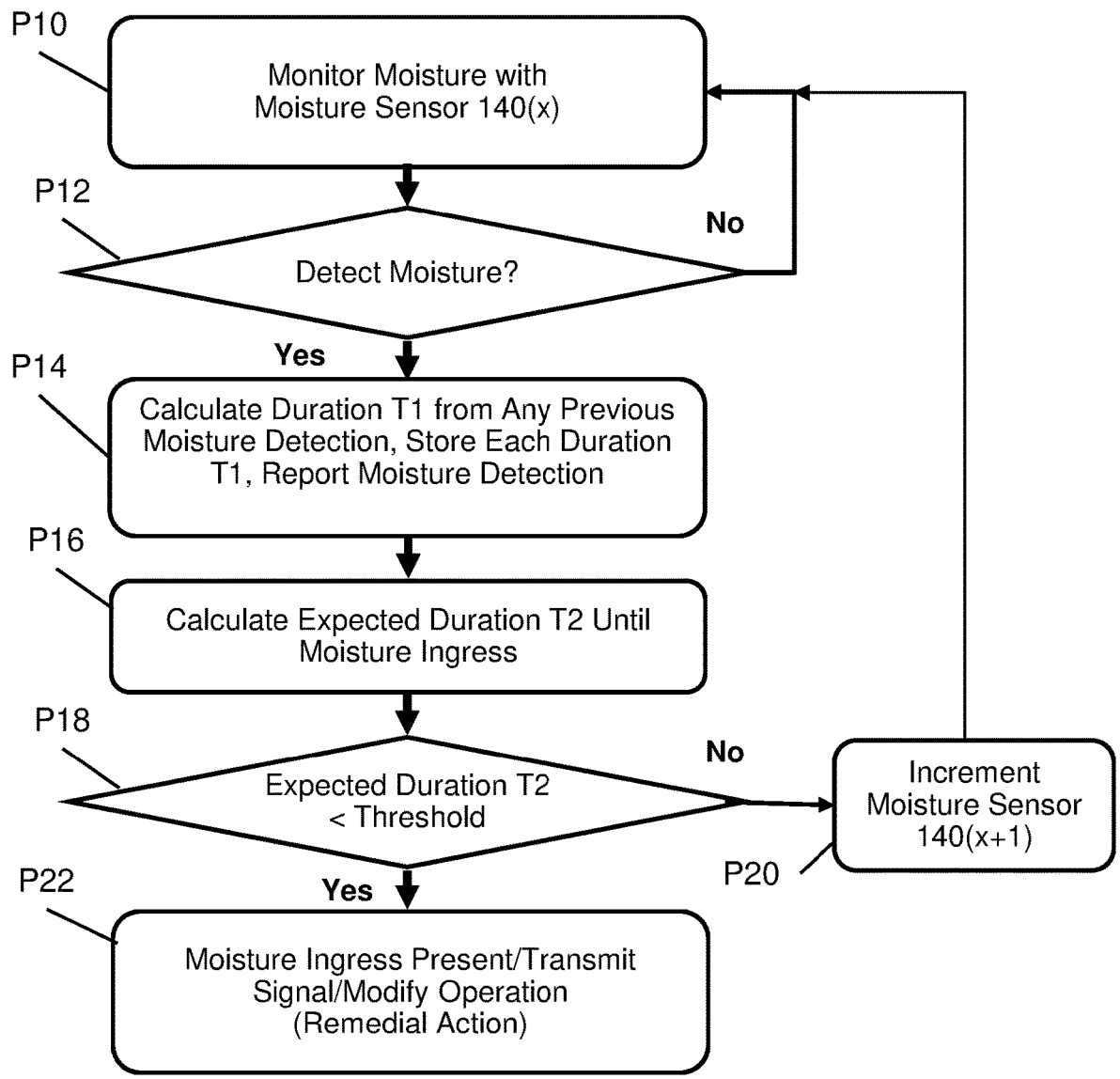
FIG. 8 shows a flow diagram of a method of monitoring moisture ingress in an IC structure, according to embodiments of the disclosure.

With reference to the flow diagram of FIG. 8, a method of monitoring for moisture ingress in IC structure 100 and PIC structure 120 will now be described. In processes P10-P12, MDC 190 detects moisture in the plurality of moisture sensors 140. As noted, plurality of moisture sensors 140 are positioned along edge(s) 148 of I/O opening 124 in substrate 102 of IC structure 100. Moisture sensors 140 are positioned between primary guard ring 114 and moisture barrier 110 so they can detect moisture before it passes through guard ring 114. For purposes of description, reference will be made to the six moisture sensors 140(1)-(6) of FIGS. 4-7. It is emphasized that any number of moisture sensors 140 can be used on either edge 148 of I/O opening 124 to provide any desired level of granularity of detection.

Typically, first moisture sensor 140(1) closest to outer end 180 of I/O opening 124 senses moisture first, followed sequentially by each moisture sensor 140(2)-(6) in line until a last moisture sensor 140(6) detects moisture. The last moisture sensor 140(6) is typically the last in line moisture sensor and is near inner end 182 of I/O opening 124 and opening 150 in guard ring 114. When moisture passes through opening 150 in guard ring 114, it will likely cause some sort of failure of IC structure 100. Early and accurate detection of moisture ingress of IC structure 100 allows for remedial action to be taken before it is impossible. The type of remedial action can vary depending on factors such as but not limited to: the age of IC structure 100, risks associated with any downtime of IC structure 100, or the availability of redundancy in active circuitry 104 or other components in IC structure 100. Note, a moisture sensor 140 being monitored to detect moisture is indicated as 140($x$) in FIG. 8, and as will be described, the variable x is incremented as the moisture sensors sequentially detect moisture.

As noted, moisture sensors 140 can be fabricated such that a distance between them is known. The spacing between moisture sensors 140 along with monitoring of the duration between sensing of moisture by each moisture sensor 140 allows accurate calculation of an expected ingress of moisture through opening 150 in guard ring 114, which could lead to failure. In certain embodiments, as noted, the spacing between moisture sensors 140 can be fabricated to be equidistant. Where moisture sensors 140 are provided on each edge 148 of I/O opening 124, they can be laterally aligned. Here, each moisture sensor is directly across I/O opening 124 from a corresponding moisture sensor (vertically on page) and are equidistant on each edge 148 of I/O opening 124. Alternatively, as shown in FIG. 9, moisture sensors 140 on each edge 148 of I/O opening 124 may be offset relative to one another (vertically on page). In either case, a distance between moisture sensors 140 on each edge 148 and relative to moisture sensors 140 on an opposing edge 148 of I/O opening 124 is generally known.

In processes P10-12, MDC 190 detects moisture in moisture sensors 140 from a first moisture sensor 140(1) closest to outer end 180 of I/O opening 124 to a last moisture sensor 140(6) of moisture sensors 140. More particularly, in process P10, MDC 190 monitors moisture with moisture sensor 140($x$), i.e., the next in line moisture sensor that has not previously detected moisture. In process P12, MDC 190 calculates whether moisture is detected by moisture sensor 140($x$). Moisture can be detected by a change in operational parameters of moisture sensor 140($x$), depending on the type of moisture sensor used. For example, where moisture sensors 140 include capacitors, they may indicate moisture presence, for example, based on current change, current differential, or a hump in a current-voltage response curve. If moisture is not detected, i.e., "No" at process P12, MDC 190 continues to monitor for moisture in moisture sensor 140($x$) in process P10. If moisture is detected, i.e., "Yes" at process P12, MDC 190 proceeds to processes P14-22.

In process P14-22, for each new moisture detection by a new moisture sensor 140($x$) of plurality of moisture sensors 140 that has not previously detected moisture, MDC 190 performs the processes described hereafter. As used herein, a "new moisture detection by a new moisture sensor" indicates a detection of moisture by a moisture sensor 140(1)-(6) that has not previously detected moisture.

In process P14, MDC 190 calculates a duration T1 from the new moisture detection to any previous moisture detection by a previous moisture sensor 140($x$−1) of the plurality of moisture sensors. More particularly, when moisture is first detected by first moisture sensor 140($x$), MDC 190 starts a timer such that when moisture is detected by a second, next in line moisture sensor 140($x$+1), duration T1 between the first and second moisture detections is known. Alternatively, when moisture is detected by a non-first moisture sensor, e.g., any of sensors 140(2)-(6), MDC 190 measures duration T1 from the previous moisture detection. In this manner, duration T1 between any two moisture detections by two moisture sensors 140 is known. MDC 190 also stores each duration T1, i.e., the duration between each sequential moisture detection by moisture sensors 140. MDC 190 may also report moisture detection to active circuitry 104.

In process P16, MDC 190 calculates an expected duration T2 until moisture ingress through guard ring 114 to active circuitry 104 of IC structure 100 based on duration(s) T1. The calculation may include multiplying an average of each previous duration T1 by a remaining number of the plurality of moisture sensors 140 not having previously detected moisture. More particularly, the average of each previous duration T1 indicates the average time between moisture detection by the equidistantly spaced moisture sensors 140. Consequently, knowing the number of remaining moisture sensors that have not detected moisture can be used to calculate an expected duration T2 until moisture ingress through guard ring 114 by multiplying the number of remaining moisture sensors 140 and the average of previous durations T2. That is, MDC 190 assumes the duration between moisture detections is generally the same between the equidistant moisture sensors 140 such that knowing the remaining number of moisture sensors allows calculation of an expected duration to moisture ingress through opening 150 in guard ring 114. In this sense, 'moisture ingress' is equated with moisture detection by last moisture sensor 140(6) adjacent to opening 150 in guard ring 114. It is understood that last moisture sensor 140(6) may be positioned such that actual moisture ingress occurs at a known, user-defined duration (e.g., see description of threshold below) after last moisture sensor 140(6) detects moisture to allow time to take remedial action before actual moisture ingress occurs through opening 150.

In process P18, MDC 190 calculates whether expected duration T2 to moisture ingress is less than a threshold. The threshold can be user defined to be any duration, e.g., a duration of sufficient length that remedial action can be taken prior to moisture ingress. In response to the expected second duration T2 being longer than the threshold, ("No" at process P18), remedial action is considered not necessary. In this case, at process P10, MDC 190 continues monitoring for moisture in the next moisture sensor 140(x+1) that has not previously detected moisture, and normal operation of IC structure 100 continues. Process P20 shows incrementing of moisture sensor to the next moisture sensor 140(x+1). In contrast, in response to the expected second duration T2 being shorter than a threshold, ("Yes" at process P18), at process P22, MDC 190 transmits a signal to active circuitry 104 of IC structure 100 to cause modification of operation of active circuitry 104. That is, MDC 190 indicates moisture is imminent (after passing of the threshold duration). The modification of active circuitry 104 may include any remedial action, which can take a variety of forms. In one embodiment, MDC 190 may deactivate certain active circuitry 104 considered to be imminently exposed to moisture. In another embodiment, MDC 190 may deactivate certain active circuitry 104 considered to be imminently exposed to moisture and activate redundant active circuitry 104. In another embodiment, MDC 190 may indicate replacement of IC structure 100 is required, e.g., at a certain time or immediately. Other modifications and remedial actions are also possible.

Embodiments of the disclosure provide various technical and commercial advantages, examples of which are discussed herein. The moisture sensors provide an early and definitive alarm for moisture (with no false alarms) and allow for remedial action to be taken before it is impossible. The system accurately predicts time to failure and allows adjustment based on real time field data input but requires no additional area for the moisture sensors. The teachings of the disclosure are advantageous for any IC structure having an I/O opening. The system is especially advantageous for PIC structures having long optical I/O openings in their guard ring (and crack stop) because it eliminates premature indications of moisture ingress.

The structure and method as described above are used in the fabrication of integrated circuit chips such as photonics integrated circuit chips. The resulting chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (1) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. An integrated circuit (IC) structure, comprising:
a substrate; and
a plurality of moisture sensors along an edge of an input/output (I/O) opening in the substrate, the plurality of moisture sensors positioned laterally between a primary guard ring and a moisture barrier.

2. The IC structure of claim 1, wherein the plurality of moisture sensors are positioned in at least one back-end-of-line interconnect layer over the substrate.

3. The IC structure of claim 1, wherein each moisture sensor includes a capacitor having a first terminal and a second terminal.

4. The IC structure of claim 3, wherein both the first terminals and the second terminals extend through the guard ring.

5. The IC structure of claim 3, wherein the first terminals extend through the guard ring, and the second terminals are electrically coupled to the guard ring.

6. The IC structure of claim 3, further comprising at least one wire extending through an opening in the guard ring and electrically coupled to at least one of the first terminals and the second terminals of the plurality of moisture sensors.

7. The IC structure of claim 1, further comprising a secondary guard segment between the plurality of moisture sensors and the I/O opening, the secondary guard segment detached from the primary guard ring.

8. The IC structure of claim 1, wherein the I/O opening includes a V-groove for a photonics component and the plurality of moisture sensors are located along the V-groove.

9. The IC structure of claim 1, wherein the plurality of moisture sensors are equidistantly spaced along the I/O opening.

10. The IC structure of claim 1, further comprising a moisture detection circuit operatively coupled to the plurality of moisture sensors and configured to:
    detect moisture in the plurality of moisture sensors from a first moisture sensor closest to an outer end of the I/O opening to a last moisture sensor of the plurality of moisture sensors; and
    for each new moisture detection by a new moisture sensor of the plurality of moisture sensors:
        calculate a first duration from the new moisture detection to any previous moisture detection by a previous moisture sensor of the plurality of moisture sensors;
        calculate an expected second duration until moisture ingress through the guard ring to active circuitry of the IC structure based on the first duration; and
        in response to the expected second duration being shorter than a threshold, transmitting a signal to the active circuitry of the IC structure to cause modification of operation of the active circuitry.

11. A photonics integrated circuit (PIC) structure, comprising:
    a substrate;
    a primary guard ring surrounding active circuitry in the substrate;
    a moisture barrier surrounding the guard ring;
    an optical input/output (I/O) opening in the substrate;
    a photonics component positioned in the optical I/O opening; and
    a plurality of moisture sensors along an edge of the optical I/O opening in the substrate, the plurality of moisture sensors positioned between the primary guard ring and the moisture barrier.

12. The PIC structure of claim 11, wherein each moisture sensor includes a capacitor having a first terminal and a second terminal.

13. The PIC structure of claim 12, wherein both the first terminals and the second terminals extend through the guard ring.

14. The PIC structure of claim 12, wherein the first terminals extend through the guard ring, and the second terminals are electrically coupled to the guard ring.

15. The PIC structure of claim 12, further comprising at least one wire extending through an opening in the guard ring and electrically coupled to at least one of the first terminals and the second terminals of the plurality of moisture sensors.

16. The PIC structure of claim 11, further comprising a secondary guard segment between the plurality of moisture sensors and the optical I/O opening, the secondary guard segment detached from the primary guard ring.

17. The PIC structure of claim 11, further comprising a moisture detection circuit operatively coupled to the plurality of moisture sensors and configured to:
    detect moisture in the plurality of moisture sensors sequentially from a first moisture sensor closest to an outer end of the I/O opening to a last moisture sensor of the plurality of moisture sensors; and
    for each new moisture detection by a new moisture sensor of the plurality of moisture sensors:
        calculate a first duration from the new moisture detection to any previous moisture detection by a previous moisture sensor of the plurality of moisture sensors;
        calculate an expected second duration until moisture ingress through the guard ring to active circuitry of the IC structure based on the first duration; and
        in response to the expected second duration being shorter than a threshold, transmitting a signal to the active circuitry of the IC structure to cause modification of operation of the active circuitry.

18. A method of monitoring for moisture ingress in an integrated circuit (IC) structure, comprising:
    for a plurality of moisture sensors along an edge of an input/output (I/O) opening in a substrate of the IC structure, the plurality of moisture sensors positioned between a primary guard ring and a moisture barrier:
    detecting moisture in the plurality of moisture sensors from a first moisture sensor closest to an outer end of the I/O opening to a last moisture sensor of the plurality of moisture sensors;
    for each new moisture detection by a new moisture sensor of the plurality of moisture sensors:
        calculating a first duration from the new moisture detection to any previous moisture detection by a previous moisture sensor of the plurality of moisture sensors;
        calculating an expected second duration until moisture ingress through the guard ring to active circuitry of the IC structure based on the first duration;
        in response to the expected second duration being shorter than a threshold, transmitting a signal to the active circuitry of the IC structure to cause modification of operation of the active circuitry.

19. The method of claim 18, wherein calculating the expected second duration until moisture ingress through the guard ring to the active circuitry of the IC structure includes multiplying an average of each previous first duration by a remaining number of the plurality of moisture sensors not having previously detected moisture.

20. The method of claim 18, wherein the plurality of moisture sensors are equidistantly spaced along the I/O opening.

* * * * *